(12) United States Patent
Schüler et al.

(10) Patent No.: US 12,093,780 B2
(45) Date of Patent: Sep. 17, 2024

(54) READING OPTICAL CODES

(71) Applicant: SICK AG, Waldkirch (DE)

(72) Inventors: Pascal Schüler, Waldkirch (DE); Steffen Zopf, Waldkirch (DE)

(73) Assignee: SICK AG, Waldkirch (DE)

( * ) Notice: Subject to any disclaimer, the term of this patent is extended or adjusted under 35 U.S.C. 154(b) by 0 days.

(21) Appl. No.: 18/121,502

(22) Filed: Mar. 14, 2023

(65) Prior Publication Data
US 2023/0316025 A1 Oct. 5, 2023

(30) Foreign Application Priority Data
Apr. 5, 2022 (EP) .................................... 22166611

(51) Int. Cl.
*G06K 7/14* (2006.01)
*H03M 13/09* (2006.01)

(52) U.S. Cl.
CPC ......... *G06K 7/1473* (2013.01); *G06K 7/1417* (2013.01); *H03M 13/096* (2013.01)

(58) Field of Classification Search
CPC ............................ G06K 7/1473; G06K 7/1417
USPC ........................................................ 235/462.1
See application file for complete search history.

(56) References Cited

U.S. PATENT DOCUMENTS

| | | | | |
|---|---|---|---|---|
| 6,513,714 B1 * | 2/2003 | Davis | ...................... | G06K 7/14 235/462.01 |
| 6,585,157 B2 * | 7/2003 | Brandt | ................. | G06K 7/1486 235/462.07 |
| 10,963,659 B1 * | 3/2021 | Ahmed | ................ | G06K 7/1413 |
| 2008/0185438 A1 * | 8/2008 | Pinchen | .................... | G06K 7/14 235/494 |
| 2010/0123005 A1 * | 5/2010 | Guess | .................. | G06K 7/1093 235/383 |
| 2018/0350180 A1 * | 12/2018 | Onischuk | ............... | G07C 13/00 |
| 2021/0281697 A1 * | 9/2021 | Suzuki | .............. | H04N 1/00816 |

(Continued)

FOREIGN PATENT DOCUMENTS

| EP | 3428835 A1 | 1/2019 |
|---|---|---|
| EP | 3428835 B1 | 5/2019 |

OTHER PUBLICATIONS

Search Report dated Sep. 27, 2022 issued in corresponding European Application No. 22166611.8.
(Continued)

*Primary Examiner* — Allyson N Trail
(74) *Attorney, Agent, or Firm* — Nath, Goldberg & Meyer; Jerald L. Meyer (57) ABSTRACT

A method is proposed of reading an optical code that encodes a message that has a character chain having a plurality of characters, said method comprising the steps: recording image data having the optical code; evaluating the image data with a reading of the optical code; comparing the read characters of the message with a scheme that contains a fixed character for at least one position of the message that is expected at this position in codes to be read; and recognizing an incorrectly read message and/or correcting the read message with reference to the comparison with the scheme. The scheme contains a variable character that is expected at this position in codes to be read for at least one position of the message, with a variable character being set to a partial range of the possible characters, but not to a fixed character.

17 Claims, 4 Drawing Sheets

(56) References Cited

U.S. PATENT DOCUMENTS

2021/0326665 A1* 10/2021 Dong ............... G06K 19/06037
2023/0273755 A1*  8/2023 Muraishi ............ H04N 1/00363
                                                              358/1.15

OTHER PUBLICATIONS

Universal Postal Union: "Data definition and encoding standards", Dec. 31, 2018.

* cited by examiner

Result  
JJD014600009191627300  
JJD014600008744502826  
JJD014600009200986454  
JJD014600009278066464  
JJD014600009175764525  
JJD014600008744501278  
JJD014600008744501802  
JJD014600009283643378  
JJD014600009283279219  
JJD014600009200968605

*ASCII intervals (min., max., unknown = -1*  
[74,-1][74,-1][68,-1][48,-1][49,-1], ...., [48,-1],[57,-1]......[48,-1]  
[74,74][74,74][68,68][48,48][49,49], ...., [48,48],[56,57]......[48,54]

| Scan Code | ASCII hex | ASCII dec | Characters | Scan Code | ASCII hex | ASCII dec | Ch. | Scan Code | ASCII hex | ASCII dec | Ch. | Scan Code | ASCII hex | ASCII dec | Ch. |
|---|---|---|---|---|---|---|---|---|---|---|---|---|---|---|---|
| | 00 | 0 | NUL ^@ | | 20 | 32 | SP | | 40 | 64 | @ | 0D | 60 | 96 | ` |
| | 01 | 1 | SOH ^A | 02 | 21 | 33 | ! | 1E | 41 | 65 | A | 1E | 61 | 97 | a |
| | 02 | 2 | STX ^B | 03 | 22 | 34 | " | 30 | 42 | 66 | B | 30 | 62 | 98 | b |
| | 03 | 3 | ETX ^C | 29 | 23 | 35 | # | 2E | 43 | 67 | C | 2E | 63 | 99 | c |
| | 04 | 4 | EOT ^D | 05 | 24 | 36 | $ | 20 | 44 | 68 | D | 20 | 64 | 100 | d |
| | 05 | 5 | ENQ ^E | 06 | 25 | 37 | % | 12 | 45 | 69 | E | 12 | 65 | 101 | e |
| | 06 | 6 | ACK ^F | 07 | 26 | 38 | & | 21 | 46 | 70 | F | 21 | 66 | 102 | f |
| | 07 | 7 | BEL ^G | 0D | 27 | 39 | ' | 22 | 47 | 71 | G | 22 | 67 | 103 | g |
| 0E | 08 | 8 | BS ^H | 09 | 28 | 40 | ( | 23 | 48 | 72 | H | 23 | 68 | 104 | h |
| 0F | 09 | 9 | TAB ^I | 0A | 29 | 41 | ) | 17 | 49 | 73 | I | 17 | 69 | 105 | i |
| | 0A | 10 | LF ^J | 1B | 2A | 42 | * | 24 | 4A | 74 | J | 24 | 6A | 106 | j |
| | 0B | 11 | VT ^K | 1B | 2B | 43 | + | 25 | 4B | 75 | K | 25 | 6B | 107 | k |
| | 0C | 12 | FF ^L | 33 | 2C | 44 | , | 26 | 4C | 76 | L | 26 | 6C | 108 | l |
| 1C | 0D | 13 | CR ^M | 35 | 2D | 45 | - | 32 | 4D | 77 | M | 32 | 6D | 109 | m |
| | 0E | 14 | SO ^N | 34 | 2E | 46 | . | 31 | 4E | 78 | N | 31 | 6E | 110 | n |
| | 0F | 15 | SI ^O | 08 | 2F | 47 | / | 18 | 4F | 79 | O | 18 | 6F | 111 | o |
| | 10 | 16 | DLE ^P | 0B | 30 | 48 | 0 | 19 | 50 | 80 | P | 19 | 70 | 112 | p |
| | 11 | 17 | DC1 ^Q | 02 | 31 | 49 | 1 | 10 | 51 | 81 | Q | 10 | 71 | 113 | q |
| | 12 | 18 | DC2 ^R | 03 | 32 | 50 | 2 | 13 | 52 | 82 | R | 13 | 72 | 114 | r |
| | 13 | 19 | DC3 ^S | 04 | 33 | 51 | 3 | 1F | 53 | 83 | S | 1F | 73 | 115 | s |
| | 14 | 20 | DC4 ^T | 05 | 34 | 52 | 4 | 14 | 54 | 84 | T | 14 | 74 | 116 | t |
| | 15 | 21 | NAK ^U | 06 | 35 | 53 | 5 | 16 | 55 | 85 | U | 16 | 75 | 117 | u |
| | 16 | 22 | SYN ^V | 07 | 36 | 54 | 6 | 2F | 56 | 86 | V | 2F | 76 | 118 | v |
| | 17 | 23 | ETB ^W | 08 | 37 | 55 | 7 | 11 | 57 | 87 | W | 11 | 77 | 119 | w |
| | 18 | 24 | CAN ^X | 09 | 38 | 56 | 8 | 2D | 58 | 88 | X | 2D | 78 | 120 | x |
| | 19 | 25 | EM ^Y | 0A | 39 | 57 | 9 | 2C | 59 | 89 | Y | 2C | 79 | 121 | y |
| | 1A | 26 | SUB ^Z | 34 | 3A | 58 | : | 15 | 5A | 90 | Z | 15 | 7A | 122 | z |
| 01 | 1B | 27 | Esc ^[ | 33 | 3B | 59 | ; | | 5B | 91 | [ | | 7B | 123 | { |
| | 1C | 28 | FS ^\ | 2B | 3C | 60 | < | | 5C | 92 | \ | | 7C | 124 | \| |
| | 1D | 29 | GS ^] | 0B | 3D | 61 | = | | 5D | 93 | ] | | 7D | 125 | } |
| | 1E | 30 | RS ^^ | 2B | 3E | 62 | > | 29 | 5E | 94 | ^ | | 7E | 126 | ~ |
| | 1F | 31 | US ^_ | 0C | 3F | 63 | ? | 35 | 5F | 95 | _ | 53 | 7F | 127 | DEL |

- ▭ Non-printable characters
- ▭ Special character #1
- ▭ Numerals
- ▭ Special character #2
- ▬ Upper case letters
- ▬ Special character #3
- ▬ Lower case letters

Figure 6

READING OPTICAL CODES

The invention relates to a method of reading an optical code and to an optoelectronic code reader respectively.

Code readers are known from supermarket checkouts, for automatic parcel identification, for sorting mail shipments, from baggage handling at airports, and from other logistics applications. In a code scanner, a reading beam is guided transversely over the code by means of a rotating mirror or by means of a polygon mirror wheel. A camera-based code reader records images of the objects having the codes located thereon with the aid of an image sensor and image evaluation software extracts the code information from these images.

In an important application group, the objects bearing the code are conveyed past the code reader. A scanning code reader here detects the respective codes successively led into its reading zone. Alternatively, in a camera based code reader, a line scan camera reads in the object images having the code information successively and linewise with the relative movement. As a rule, image data are recorded using a two-dimensional image sensor that overlap more or less depending on the recording frequency and on the conveying speed. So that the objects can be arranged in any desired orientation on the conveyor, a plurality of code readers are often provided at a reading tunnel to record objects from a plurality of sides or from all sides. A scanning code reader also detects the remission and thus ultimately the image lines that can be assembled to form an object image, even though an image sensor is preferred for this purpose. Code zones can be identified in such an object image and one-dimensional or two-dimensional codes can be read out.

One of the most important quality criteria for a code reader or for a reading tunnel is a high reading rate. Reading errors make complex error remedies necessary such as the repeat manual scanning or a resorting. The cause for such errors can lie in the quality of the code itself, in an unfavorable reading situation, for example with a code under a film that causes reflections, and finally also in evaluation errors, for instance as part of the binarization of gray values or in the form of imprecisely calculated scanning positions.

To avoid reading errors, conventional decoders for two-dimensional codes such as DataMatrix, QR, Aztec, Maxicode, Dot Code, or also stack codes such as PDF417 and MicroPDF, are equipped with a Reed-Solomon error correction. This enables a powerful correction process by which even codes having larger area defects are still read correctly. This not only enables otherwise unreadable codes (NoRead) still to be read, but also avoids so-called misreadings (MisRead). A code is incorrectly read here and this is not recognized. This practically does not occur with a Reed-Solomon correction. If its error capacity is exceeded, the corresponding code can no longer simply be decoded (NoRead).

The Reed-Solomon correction is not available for barcodes, however. In this respect, the term barcode should be understood as a 1D barcode; in the literature, 2D codes are sometimes also called barcodes at times. The reading of a barcode is typically verified by means of a checksum. If the checksum calculated from the read utility data and the read checksum coincide, a correct decoding is assumed. A deviation means that at least one character in the utility data or in the checksum was read incorrectly and this as a rule has the result of a reading error (No Read).

It is possible to correct an individual non-decodable or defective utility characters via the checksum, i.e. to retroactively set the affected utility character in a kind of version of the checksum process to a value with which then the checksum calculated from the utility data coincides with the read checksum. This form of correction is restricted to a single character and is not usable for larger area impaired codes. It then remains as a reading error (NoRead).

It may additionally occur that the checksum was also incorrectly read without being noticed. This has the consequence that the utility character that is not decodable or is defective is set to an incorrect value by the correction attempt. It is even possible that the utility characters were all completely correct and only the correction attempt with the incorrect checksum introduces an error at all. A comparable situation can even arise with a correct checksum if more than one utility character has been incorrectly decoded in an unnoticed manner and the cumulative errors flow into the correct checksum by chance. The simple correction process from the checksum for barcodes thus simultaneously increases the risk of misreadings (MisRead) with the reading rate.

A checksum consequently only reliably intercepts individual errors and the conventional correction for barcodes is therefore susceptible in situations with multiple errors. It is, however, not even unusual in practice for a code to be impaired at a number of points. Examples are very wavy surfaces with flexible packing materials such as cartons, in some cases in barcode labels adhered in a cardboard fold or barcodes under a film with pronounced reflections with a large number of local, areal defects.

A method of reading an optical code is advanced in EP 3 428 835 B1 in which a code word is replaced with a code word known for a position at at least one position of the code in a pre-correction that is positioned upstream of the check process. The known code words are parameterized, are specified by a database of a higher ranking system, or are taught from a history of read codes. This is a pre-correction that is intended to complement a subsequent Reed-Solomon correction. This pre-correction does not provide any improvement for those variable sections of the code for which no code words are known. The downstream Reed-Solomon correction is responsible for error corrections in the variable sections; the advantage of EP 3 428 835 B1 comprises the full error capacity being available for this purpose after the pre-correction and is not already used up in part for corrections of the known code words. With a barcode without the possibility of the Reed-Solomon correction, all the described disadvantages of the correction via the checksum only possible with great limitations consequently remain, at least with respect to a variable portion of the code.

It is therefore the object of the invention to provide an even more reliable and more robust method of reading optical codes.

This object is satisfied by a method of reading an optical code and by an optoelectronic code reader in accordance with the respective independent claim. It must be stated as a precaution that it is an automatically running process that is in particular implemented on a computer. A human observer would anyway be hopelessly overburdened with the abundance of information. The optical code contains a message, that is that clear text that should be communicated by the optical code and that is encoded therein. The message has a character chain having a plurality of characters. It preferably also includes at least one check character, for example a checksum, in addition to the utility character. To read the code and thus the message, image date having the optical code are first recorded in one of the known manners described in the introduction. Code zones that segment the image data, for example using the contrast, are then preferably located in the image data by a pre-processing and the respective code in the code zones is decoded and the message thereby read.

The read characters of the message are compared with a scheme. The scheme contains prior knowledge of the codes to be read. It includes a fixed portion: A specific fixed character is expected at at least one position of the message in accordance with the scheme and which character is there or how the message would have to read at this position is consequently known. There can be a plurality of schemes if code families having their own respective fixed portions are present in an application situation; in this case, the suitable scheme having the best coincidence with the current code, for example. is preferably first identified and then used. The scheme makes it possible to recognize incorrectly read messages when the fixed portion of the scheme was not read as expected in the message and/or to recognize the read message in that parts of the message are corrected or replaced from the prior knowledge of the fixed portion of the scheme. Up this point, the procedure in accordance with the invention is similar to EP 3 428 835 B1 that is named in the introduction and to which reference is additionally made.

The invention now starts from the basic idea of additionally providing a variable portion in the scheme. A variable character that is not set to a fixed character, but only varies in a partial range of the characters possible overall is expected for at least one position of the message. Typical examples for a variable character are numerals or letters. The comparison of the read characters of the message with the scheme includes the variable portion. If a character of the message that does not correspond to the scheme is read at a position of a variable character, this is recognized as an error. A numeral is, for example, read at a position at which a letter should be according to the scheme. This error can be output as such (MisRead) or correction attempts can be made, for example from a checksum. In accordance with one definition, fixed characters and variable characters preclude one another and as a consequence their respective positions in accordance with the scheme differ.

The invention has the advantage that the reading rate is further increased, and indeed both with respect to non-reads (NoRead) and misreads (MisRead). A non-read requires a laborious post-treatment, for example by a repeat manual detection of the code while a misread can even signify unrecognized and particularly expensive errors in the sorting, dispatching, and in other allocations controlled by the codes. The correction in accordance with the invention is not restricted to individual errors. Missing characters can here also be supplemented and in so doing the code length can be correctly restored again. The risk of unrecognized misreads is substantially reduced, in particular after a failed correction. As will be explained even more exactly, schemes can be parameterized in a user friendly manner via an efficient syntax, for example in a user interface and can even be taught automatically from the decoding process or from corresponding logfiles. The invention is particularly suitable for barcodes in which the pre-correction of EP 3 428 835 B1 is not sufficient because no subsequent Reed-Solomon correction is available. It nevertheless remains possible to use the invention with 2D codes instead of or as complementary to a Reed-Solomon correction that is admittedly robust and powerful per se, but whose error capacity is not unlimited.

The scheme preferably has a code length and/or contains a fixed character or a variable character for every position. The scheme thus includes information on the code length, the total number of characters of the message. The scheme is preferably complete; which fixed character is there or which partial range of possible characters is possible as a variable character there is therefore known from the scheme for each position of the message. The code length that can, however, nevertheless additionally be an explicit parameter of the scheme is implicit in this completeness. A scheme can also be incomplete; there is then at least one free character also be in the limits' of the general code specification. This can in particular be a temporary state during a teaching of a scheme.

That scheme is preferably selected as the scheme to be used from a plurality of schemes whose fixed character is best located in the read message. There can be a pool of schemes for different code families that are expected in an application situation. A choice must then be made as to which scheme is checked for incorrectly read messages or for which the read message is corrected. The fixed portion of the scheme can be understood as a kind of fingerprint for this purpose. That scheme is used whose fingerprint best matches the read message. In the ideal case, the total fixed portion of a scheme is read in the message. With an only partial coincidence, an evaluation can take place, for example, via the number of read fixed characters corresponding to the scheme and/or via the highest portion of such read fixed characters.

The code preferably has a checksum and the reading of the message is validated using the checksum. The message then comprises at least one check character in addition to the utility character. A check sum is calculated from the read utility characters, by means of an algorithm that corresponds to that one with which the checksum was originally calculated on the generation of the code. If the calculated and read check sum coincide, the message is deemed as validated. Misreads (MisRead) are thereby intercepted.

A character not falling into the partial range of the characters possible for the variable character or a non-readable character at a position of a variable character is preferably corrected by means of the checksum and the result is only accepted as a correctly read message when the corrected character falls in the partial range of the characters possible for the variable character. A correction using the checksum takes place in the variable portion here. It was explained in the introduction that this is only possible for individual errors and misreads (MisRead) can be generated in the case of multiple errors. The checksum can generally only either verify the integrity of the message or be used for correction because the correction ultimately forces the integrity with the checksum. The scheme here makes possible an additional safeguarding since the corrected message still has to satisfy the scheme. At least some of the additional misreads are thereby intercepted.

The remaining fixed characters of the scheme are then preferably taken over into the message when a minimum portion of the fixed characters of the scheme, in particular at least half, was correctly read in the message. This again relates to the correction by means of the fixed portion. It is here placed under the additional condition that the fixed portion of the scheme is located in the read message with sufficient reliability. A minimum portion of read fixed characters coinciding with the scheme is required for this purpose, in particular at least half. The fixed characters of the message can be overwritten by characters of the fixed portion, but can also be inserted in the sense that the message is thereby extended. A failed validation via the checksum can provide an indication that this correction is required. With a message validated via the checksum, the check and possible correction of the fixed portion may be omitted for reasons of efficiency. Conversely, a validation is preferably made again using the checksum after the correction or the code length is checked. If an error is still present, this is output as a reading error (NoRead). The attempt is still conceivable beforehand to make a correction in the variable portion via the checksum with the risk already described in this regard of a misread (MisRead) thereby provoked. A reading error (NoRead) is preferably also present when the minimum portion of correctly read fixed characters has not been reached; the association with the scheme is then too unsafe to attempt the correction. In this respect, the robustness can be set via the minimum portion.

A message whose length does not coincide with the code length of the scheme or that has a character at a position of a variable character that does not fall in the partial range of the characters possible for the variable character is classified as a misreading. This step preferably follows on from a correction, but is also possible independently thereof, in particular when the message could be validated using the checksum from the start. The code length and the specifications with respect to variable characters enable misreads to be at least partially still discovered in the multiple error case. The read checksum can in principle also result from a plurality of incorrect characters when the variable characters satisfy the scheme, but the likelihood of such a multiple error is considerably reduced. This applies equally to cases in which the checksum was correctly read and to such cases in which the checksum itself is part of the multiple error.

A scheme preferably has at least one of the following partial ranges of possible characters of a variable character: non-printable characters, special characters, numerals, letters, lower case letters, upper case letters. These are particularly suitable examples for divisions or classes of the characters conceivable in a message. The division could take place completely at random in principle. Such semantic classes, however, facilitate the understanding of the user so that the use can be diagnosed and optimized more easily. In addition, regularities in codes are likewise rather to be found in the form of semantic classes than any desired divisions in practice. The possible characters of a code are frequently represented by numbers 0 . . . 127 of the ASCII code. Said partial portions can be found in the ASCII code.

A scheme is preferably formulated as a regular expression that indicates the permitted characters for the respective positions. A regular expression makes it easy for the user to understand and optionally edit the scheme. The internal processing is simultaneously facilitated and the error susceptibility on the programming of the decoders is reduced. Alternatively, a proprietary definition of schemes is conceivable that, however, at least approximately reaches the clarity and formal regularity of regular expressions.

A plurality of read messages are preferably evaluated to teach a scheme, with the read messages in particular being detected in operation or loaded from a logfile. Directly specifying a scheme, either by parameterization in a user interface, in particular a graphical user interface, or by reading by means of data carriers or a network would admittedly generally be conceivable. This is absolutely of advantage for the diagnosis or improvement of schemes. In this embodiment, however, an automatic teaching is provided that liberates the user from this work. The teaching is based on read messages that can preferably originate from the ongoing operation or from an earlier operation, in particular a logfile. An adaptation of schemes during operation is furthermore conceivable. It is of advantage if it is known that the messages from which the scheme is taught are correctly read messages. In addition, only reading results are preferably used that were correctly read from the start and in particular have not experienced any correction from the checksum. However, a scheme could, for example, even be deduced from read messages by statistical processes when characters are missing in some messages and/or some messages contain incorrect characters. A sorting of the read messages preferably takes place in the teaching so that only codes from a code family can enter or a plurality of schemes can be taught for a plurality of code families. The code length, but also parts of the schemes themselves, in particular different fixed portions, can be criteria for the sorting. It can therefore occur in the course of the teaching that two or more schemes are formed from one scheme on the basis of differences in the fixed portion.

A scheme is preferably taught from a distribution of read characters at the respective positions of the read message. Which characters occur at the respective positions of the message is accordingly determined. How often a character was read at the respective position can additionally be counted.

The corresponding fixed character is preferably taught at positions at which the same character is always read and the partial range formed therefrom is taught as a variable character at positions at which different characters are read. A character read again and again as the same at a position is thus assigned to the fixed portion of the scheme. Additional specifications can be made here, for instance that the fixed portion forms a block of adjacent characters or is at the start or at the end of the message. If the read characters vary at one position, the partial range spanned thereby is considered as a variable character of the scheme. This partial range can optionally still be expanded to cover a particular partial range as a whole. If, for example, the characters 1, 3, 6 were read at one position, depending on the embodiment the partial range can consist of exactly these characters $\{1, 3, 6\}$, of the whole spread$\{(1, 2, 3, 4, 5, 6\}$ between the read smallest and largest characters 1, 6 also including the non-read characters 2, 4, or of the complete class of numerals. If practically any random characters were read at a position, neither a fixed portion nor a useful variable portion can be taught for the scheme here. A blank remains in the scheme, a variable character practically without restriction, or the teaching is aborted. An attempt can furthermore be made to find a partial amount of the read messages in which outliers are eliminated that have brought about this situation. The outliers can be output so that the user has a possibility to check whether it is justified not to take account of these read messages in the scheme.

A scheme is preferably first initialized with blank regions per position, the respective first character read at a position is stored for this position, and every character that is read at a position after the first character for this position and that was still unknown for this position expands the partial range for this position such that the read character is covered. This is an advantageous implementation of the teaching of schemes. In this respect, sorting is as always preferably performed such that the read messages from which the respective scheme is taught belong to the same code family. A blank scheme is initialized that initially has no prior knowledge for any position. A respective character read at a position is first considered as a fixed character of the scheme. This should then be confirmed via the further read messages, however. It can also be required that a fixed character was read at least m times or m of n times. If a different character is read at a position, this can be considered as an outlier in accordance with an m of n criterion. The characters previously read at this position preferably span the partial range of a variable character. The partial range can be expanded with every newly read character at a position of a variable character. The partial range should preferably remain restricted to a class such as numerals or letters; otherwise a particularly large partial range or an error message of the teaching is conceivable because no regularity or systematics can be recognized at this position that can be sensibly detected in a scheme.

In a preferred further development, an optoelectronic code reader is provided having at least one light reception element for the generation of image data from received light and having an internal and/or external control and evaluation unit in which a method in accordance with the invention for reading optical codes is implemented.

The invention will be explained in more detail in the following also with respect to further features and advantages by way of example with reference to embodiments and to the enclosed drawing. The Figures of the drawing show in.

Figure 1:
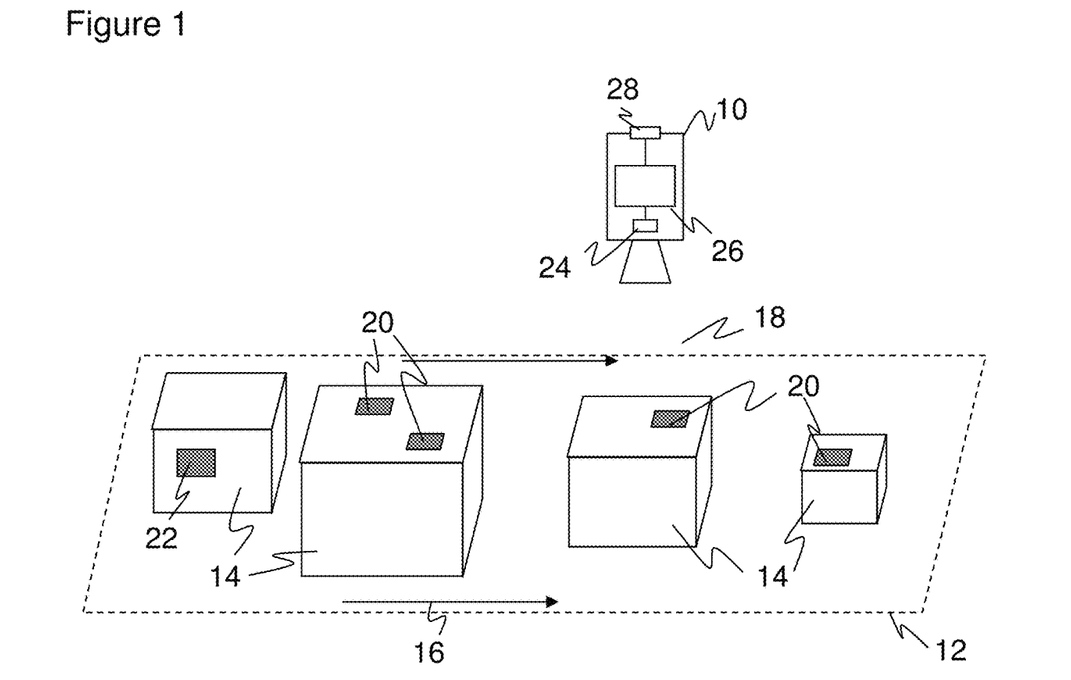
FIG. 1 a schematic overview representation of a code reader that is installed by way of example above a conveyor belt on which objects having optical codes to be read are conveyed, FIG. 2 an example image of an optical code beneath a film that is difficult to read due to reflections.

FIG. 1 shows an optoelectronic code reader 10 which is mounted above a conveyor belt 12 which conveys objects 14 through the detection zone 18 of the code reader 10, as indicated by the arrow 16. The objects 14 bear code zones 20 on their outer surfaces which are detected and evaluated by the code reader 10. These code zones 20 can only be recognized by the code reader 10 when they are affixed to the upper side or at least in a manner visible from above. Differing from the representation in FIG. 1, a plurality of code readers 10 can be installed from different directions for the reading of a code 22 affixed to the side or to the bottom, for instance, in order to permit a so-called omnireading from all directions. The arrangement of the plurality of code readers 10 to form a reading system mostly takes place as a reading tunnel in practice. This stationary use of the code reader 10 at a conveyor belt is very common in practice. The invention, however, relates to the reading of codes or to the code reader 10 itself so that this example may not be understood as restrictive. Codes can also be scanned by hand, for example, or a code or an object 14 having a code can be held in the reading field of the code reader 10 in a presentation application.

The code reader 10 detects image data of the conveyed objects 14 and of the code zones 20 by a light receiver 24 and said image data are further processed by a control and evaluation unit 26 by means of image evaluation and decoding processes. It is not the specific imaging process that is important for the invention so that the code reader 10 can be set up in accordance with any principle known per se. For example, only one respective line is detected, either by means of a linear image sensor or by means of a scanning process, and the control and evaluation unit assembles the lines detected in the course of the conveying movement to the image data. A larger zone can already be detected in a recording using a matrix-like image sensor, with the assembly of recordings here also being possible both in the conveying direction and transversely thereto. The central function of the code reader 10 is the decoding, i.e. the reading of the message encoded in an optical code as clear text. The message is a character chain of utility characters, preferably with at least one check character that is typically at the end. The code reader 10 outputs information such as messages or image data read from the codes via an interface 28.

A check and/or correction of the respective message read from a code will be explained in the following with reference to FIGS. 2 to 6. It is preferably carried out in the control and evaluation unit 26. It is, however, equally conceivable to output image data or intermediate results via the interface 28 and to outsource at least some of the decoding, checking, and/or correction to a higher ranking system such as a control processor, a network, or a cloud. Pre-processing of the image data for segmentation and for localizing code zones 20 and the decoding per se are assumed as known and not described.

Figure 2:
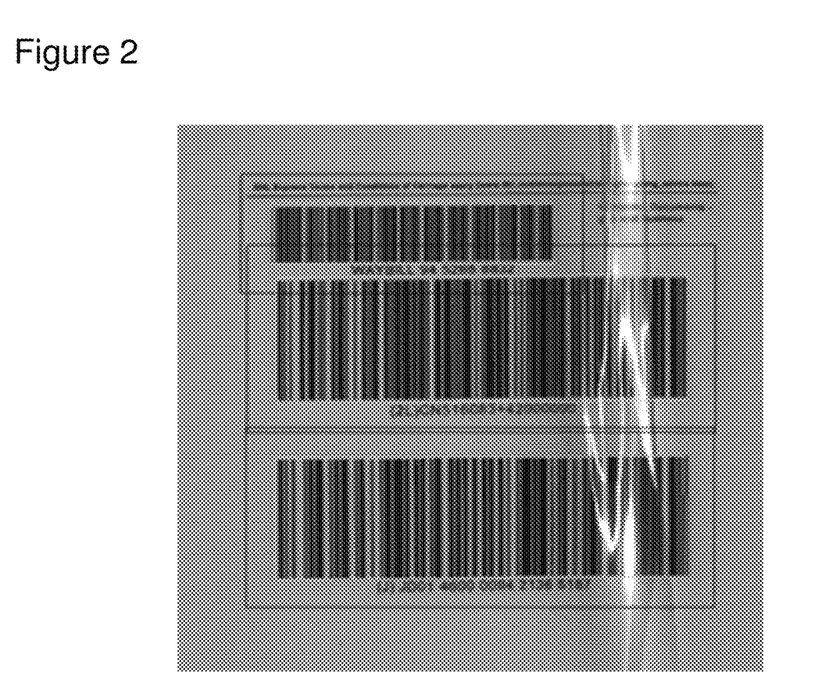

FIG. 2 shows an example image of an optical code beneath a film that is difficult to read due to reflections. A plurality of codes are located on the label as also frequent in practice. So-called sorting-relevant codes that bear the information relevant to the downstream sorting of an object are particularly important for the code reading. Different codes can be affixed alongside. However, it does no good if, for example, the topmost code in FIG. 2 can be read and a sorting-relevant code cannot. In addition, situations are naturally also conceivable in which the reflections or other damage or disruptions of the code relate to all the codes of a code zone 20 or in which conversely all the codes are sorting relevant or whose correct decoding is otherwise indispensable for the use.

Prior knowledge of the codes in a scheme is detected to improve the reading rate for codes such as those in FIG. 2 that are impaired by reflections or other damage. Read messages can then be supplemented using the scheme to still avoid reading errors (NoReads) or error readings (MisReads) can thus be detected. This is explained for the example of barcodes such as are also shown in FIG. 2. The invention is particularly useful for this purpose since powerful corrections such as Reed-Solomon encodings are available for this purpose without thus wanting to exclude the application of the invention to other code types.

Figure 3:
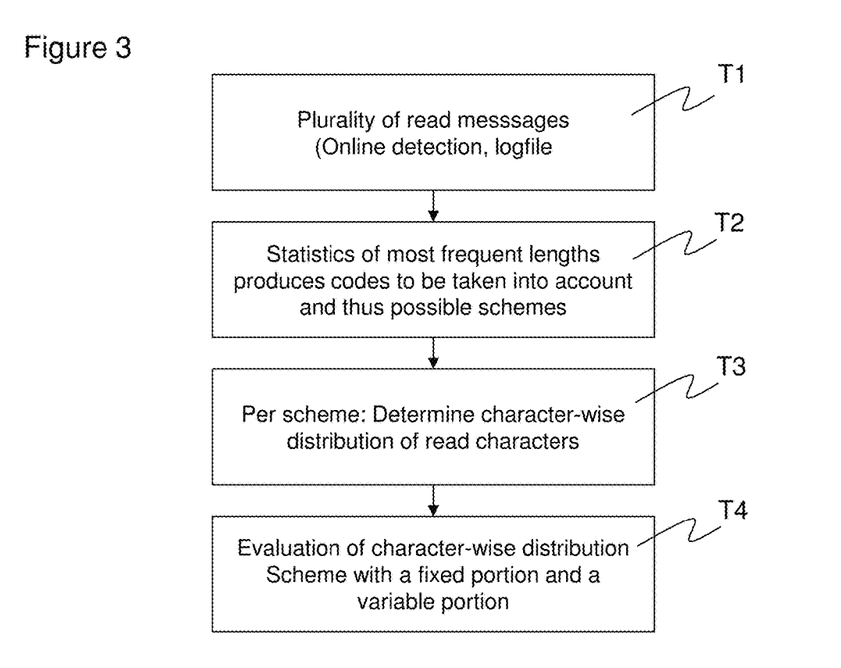
FIG. 3 an exemplary flowchart for teaching schemes for checking and/or correcting messages read from optical codes.

FIG. 3 shows an exemplary flowchart for the automatic teaching of schemes. Alternatively, a scheme can be input via a user interface, in particular a graphical user interface, or can be input from a data carrier. A user interface is also suitable to display, to check, and optionally to edit taught schemes.

In a step T1, a plurality of read messages are detected. They are results of decodings of optical codes such as will occur in the later application. The read messages can be gradually detected during the ongoing operation and/or from the past, for example a log file with earlier reading results.

In a step T2, the read messages are evaluated in accordance with code types that occur, for example by statistics of the code lengths that occur. It can be determined therefrom for which code families a scheme should be generated. If, for example, only sorting-relevant codes should be checked or corrected using a scheme, the corresponding code family is recognized by its code length, by specific identifiers or contents. A scheme is respectively only set up from the partial amount of read messages that belong to the corresponding code family. It is conceivable that only a single scheme is taught, and indeed either for the most frequently occurring codes or a predefined code family. Only pre-sorted read messages are preferably then provided in step T1 that match this code family.

In a step T3, which characters occur at which positions is evaluated in a step T3 for the read messages relating to a code family or to a scheme. A disordered amount of the characters read for these positions can then simply be appended for this purpose, for example, or a respective range is formed in which all the characters read at the position lie, or a real frequency distribution of the read characters is formed per position.

In a step T4, the scheme is derived from the character-wise distribution. As a rule it has a fixed portion and a variable portion. The fixed characters of the fixed portion of the scheme are repeated in all the characters of the respective code family read during the teaching or at least in a plurality of m from n cases to take account of outliers. The fixed portion is also a possibility to identify the code family of the scheme. It is possible therefore to generate at least one additional scheme. For when two different fixed portions are located at the same positions in the read messages, they are presumably in truth not the same code family, but two code families. The fixed portion can later serve in operation to find the correct scheme for the currently read code.

The variable characters of the variable portion of the scheme are not identical over the read messages like the fixed characters, but remain within a partial range of the possible characters. They are letters or numerals, for example. If the spread of the distribution at a position determined in step T3 becomes too great at one position, the variable character at some point loses its sense because it practically has no predictive force. It then becomes a free character, which can be tolerated in a scheme, but can also result in an error message that no suitable scheme is possible for these input data, particularly if there are a plurality of free characters.

The steps T1 to T4 by no means only have to be run through strictly once as shown. A step-wise or iterative procedure is in particular possible in which further read messages are evaluated one after the other. A further scheme is correspondingly possibly then opened and the scheme matching the read message is supplemented in steps T3 and T4. Such an iterative adaptation of the schemes is also conceivable on the fly during the actual reading operation. It can be required that a minimum number of read messages enters into a scheme so that its significance is statistically secured.

Figure 4:
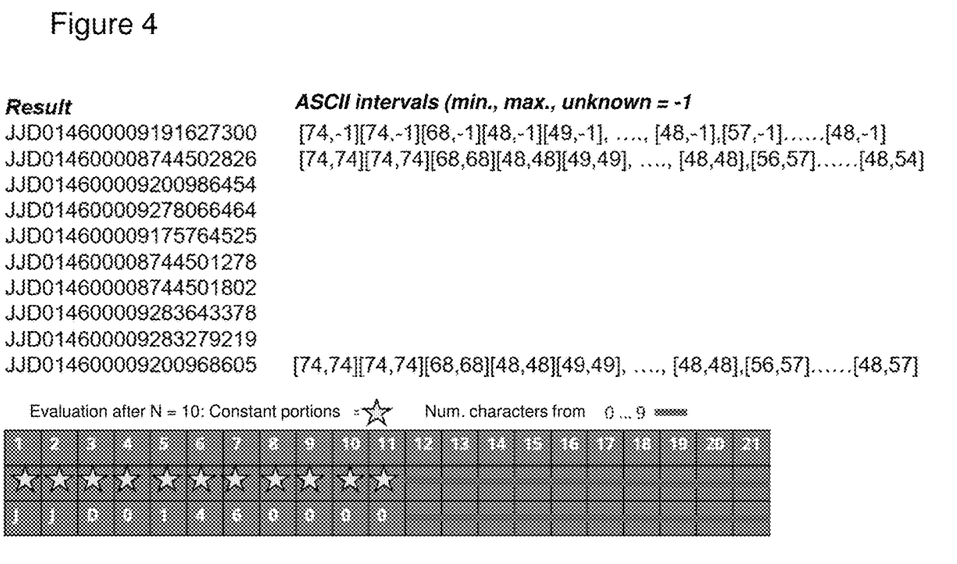
FIG. 4 a representation of a plurality of read messages with an illustration of a scheme taught therefrom.

FIG. 4 shows a representation of a plurality of read messages with an illustration of a scheme taught therefrom. This a special advantageous implementation of the teaching in accordance with FIG. 3 by which the acquisition of the prior knowledge is further illustrated in the form of schemes.

Figure 5:
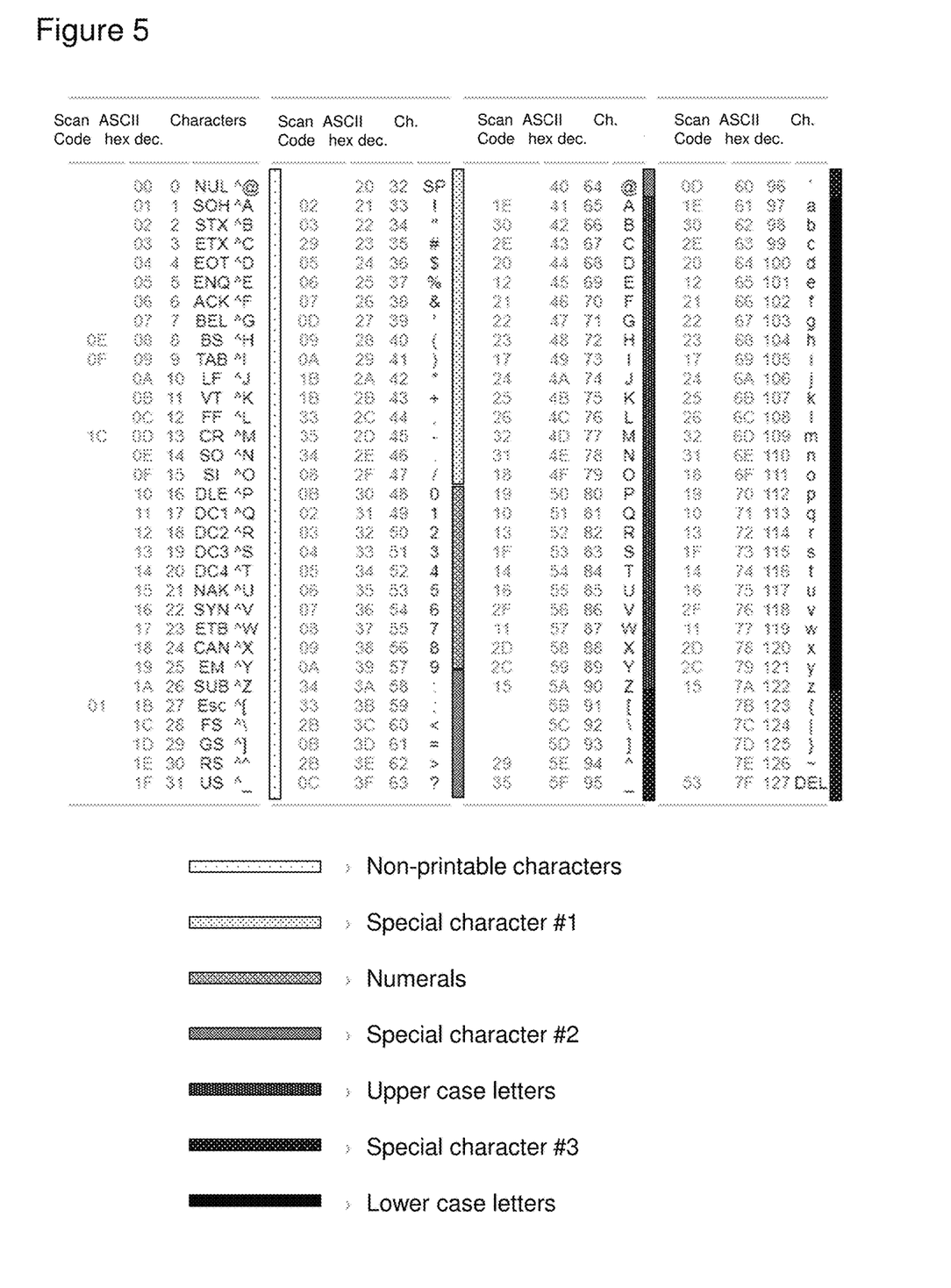
FIG. 5 an exemplary division of the possible characters, here in ASCII code, in partial ranges of variable portions of a scheme.

For this purpose, FIG. 5 additionally shows an exemplary division of the possible characters in partial ranges for the variable characters of a scheme. The table contains the ASCII values from 0 . . . 127 of particular interest for barcodes and divides them into seven classes: non-printable characters, special characters #1, numerals, special characters #2, upper case letters, special characters #3, lower case letters. The corresponding ASCII value ranges can be taken directly from the table with reference to the legend and the marked bars. The invention is naturally not restricted specifically to these classes. It is, however, sensible to form semantic classes because this is easier to understand for the user and because real code families typically follow a syntax in which the variable characters are restricted to semantic and not arbitrary partial ranges.

Returning to FIG. 4, ten read messages of a code length 21 are shown there at the top left as input data in accordance with step T1 of FIG. 3. The read messages are preferably uncorrected. It is fixed in this simplified message that all the read messages belong to the same code family and only one scheme is to be taught so that step T2 of FIG. 3 is omitted.

The lower and upper ASCII limits of the read characters that had previously occurred are shown at the top right in FIG. 4 corresponding to step T3 of FIG. 3 for each position of the code. They are initialized by a value impossible for a character such as [−1, −1]. A character measured for a respective position then modifies the limits. A "J" with ASCII code 74 is, for example, read as the first character in the first line and the lower limit is set to this value 74. On a repeat reading of the recurring "J" at the first position in the second line, the upper limit is also set to the value 74. Alternatively, the upper limit or both limits could be occupied by the value on the first reading of a character at a position. The procedure shown has the advantage that at least the first confirmation of a recurring value remains recognizable; a further parameter could be added here or could be encoded in the limits that counts the repeats.

The rear variable characters are treated exactly the same on the first reading of a character at their position. Further characters read at such a position are either already within the known limits or overwrite the lower limit or the upper limit so that the newly read character is now covered in the respective partial range. The lower limit 48 of the ASCII code of the read "0" thus results, for example, for the last character, The upper limit corresponding to the read "6" is set to the associated ASCII code 54 in the second line. The partial range [48, 57] with the limits of the ASCII codes for the numerals "0" and "9" is produced after ten read messages because they are the two extreme values that occur at this position in the ten messages.

The scheme produced after step T4 of FIG. 3 is shown in the lower part of FIG. 4. For this purpose, the distributions that are acquired per position of the message or of the scheme in step T3 and that are shown in the last line of the upper right part of FIG. 4 are evaluated. The character sequence "JJD01460000", that is the fixed portion of the scheme, is always repeated in the front part of the read messages. This is recognized in that the lower and upper limits coincide at these positions; that is the respective same character was read in all ten messages.

The remaining rear part of the messages is the variable portion. The lower and upper limits respectively differ from one another here. For the respective variable character, the spread acquired for it in accordance with the lower and upper limits can now generally be used. However, a generalization is preferably made to a class and the lower or upper limits are set to the associated class limit. For example, only the numerals "8" and "9" occur at the twelfth position, the first position of the variable portion, in the ten messages of FIG. 4; the partial range [56, 57] was determined accordingly. Differing from this original partial range, however, the class is now opened; all the numerals should be permitted at this position in the scheme. The partial range of the scheme therefore becomes [48, 57].

It is conceivable that the characters read at a position burst the limits of a class. This can be an abort reason for the training because such a scheme should not be permitted. Multi-classes are alternatively permitted. The limit first determined can for this purpose be displaced to the next lower or upper class limit. A contiguous partial range over a plurality of classes thereby arises. In principle, disjunctive classes are also conceivable; for instance numerals and lower case letters that are separate from one another in the ASCII table of FIG. 5. A check must then already be made during the determination of the partial ranges whether a newly read character bursts the previous class limit and two additional limits are then supplemented to detect the new classes. One of the classes of such a variable character with multi-classes can be replaced with a single character. Numerals and the special character "+" are then permitted for this variable, for example. It is sensible only to allow the classes to become just as large as necessary. The variable characters should cover the characters occurring in operation, but should be as selective as possible under this condition.

The scheme in FIG. 4 contains a fixed portion at the start and a variable portion at the end. The invention is not restricted thereto; a plurality of fixed portions and/or a plurality of variable portions can be present in any desired arrangements. In principle, whether it is a fixed or variable character can be individually laid down for every position and every character; there are no restrictions in this regard.

Figure 6:
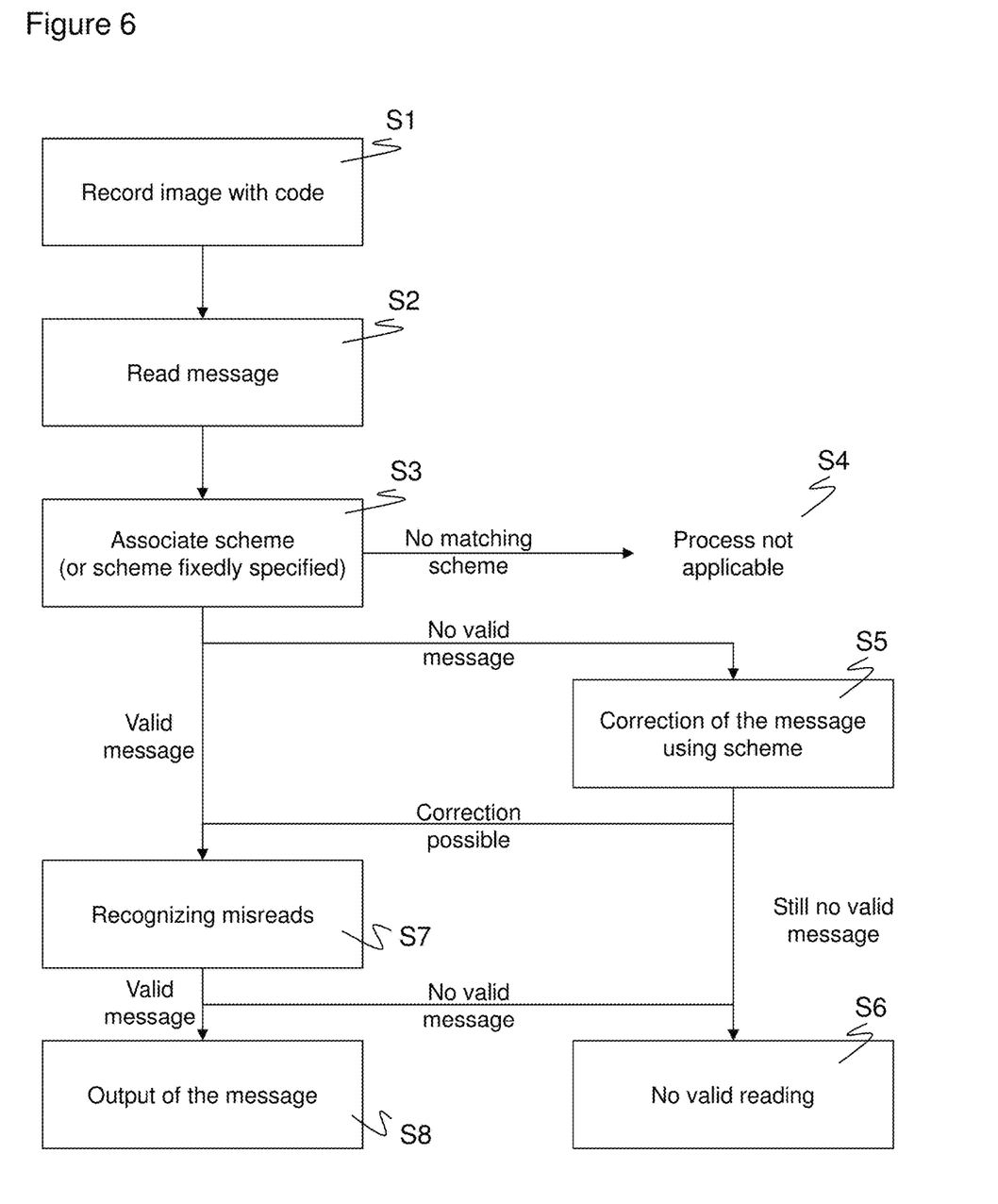
FIG. 6 an exemplary flowchart for the checking and/or correction of messages read from optical codes with reference to a scheme.

FIG. 6 shows an exemplary flowchart for the checking and/or correction of messages read from optical codes with reference to a scheme. At least one scheme is specified beforehand or is taught according to a process explained with reference to FIGS. 3 to 5.

In a step S1, an image with a code zone 20 is recorded by the code reader 10. In a step S2 the image data are evaluated using a decoder, as described with reference to FIG. 1, to read the message contained in the code.

A matching scheme is associated in a step S3. A decision is made on this using the code length, the code type, and/or with reference to parts of the message.

The fixed portion of the scheme can in particular be used as a kind of fingerprint to identify the codes matching the scheme. Alternatively, there is only one scheme or a scheme is fixedly specified. If no scheme should match the message, the further process shown in FIG. 6 is not applicable and is aborted or skipped in a step S4. The read message is then treated as without the invention, i.e. a read message can be output, a recognized error remains, or still other corrections or checks are carried out than those in accordance with the invention using a scheme.

A decision is now made with the matching scheme whether the message read in step S2 is a valid message or not. A checksum can be used for this purpose, for example. Where possible, at least parts of the message have not been readable at all.

If the message is invalid, a correction is attempted with reference to the scheme in a step S5. The fixed portion of the scheme is compared with the characters at the corresponding positions of the read message for this purpose. A minimum portion, for example at least half, of the fixed characters should preferably coincide in the scheme and the read message to provide sufficient security that a code matching the scheme and having this fixed portion was actually read. Such a test has possibly already taken place in step S3; it then does not have to be repeated.

If the comparison is positive, the fixed portion of the scheme is transferred to the message. In this respect, the fixed characters of the message are overwritten by those of the scheme and where necessary characters are inserted to reach the correct code length overall. In another embodiment, it may be required that the code length of the message already corresponds to the required code length of the scheme before the correction; no characters are then inserted.

The fixed portion of the message is forcedly correct after the correction in accordance with step S5. There is only a residual likelihood that the minimum portion of coincidence in the fixed portion is not sufficient and the read code actually does not comprise this fixed portion. However, the error was possibly not in the fixed portion alone, but rather one character or a plurality of characters in the variable portion have additionally been incorrectly decoded. To preclude such cases, the corrected message is again subjected to a check, for example using a checksum. It is now assumed in the case of success that the corrected message is a correct reading result. Otherwise, a correction can be attempted in the variable portion from the checksum, as described above, but the power and reliability of this process is limited.

In a first correction example, let the scheme that one that was taught in FIG. 4 with a code length 21 and the fixed portion "JJD1460000" at the positions 1-11, followed by a variable portion of numerals at the positions 12-21. This scheme is also used in all further correction examples. The message "XJD0236000092780664464" was now read by way of example with a checksum 18 and differences from the fixed portion of the scheme printed in bold. The check using the checksum is not successful; an attempt for correction is therefore made and the fixed portion, that is in coincidence with considerably more than half, is transferred into the read message: "JJD014600009278066464". The checksum is now also correct; it is therefore a valid message.

Let the read message be "D014600009278066464". in a second correction example. The error is now that the first two characters were not read; the initial "JJ" is missing. The message is thereby too short by two characters with respect to the required code length of 21. It is therefore not significant whether the checksum randomly incorrectly indicates a valid message; this would be an independent second indicator. The coincidence in the fixed portion is always even greater than the required minimum portion of 50%. The fixed portion of the scheme can therefore be inserted in the correct position, i.e. the two first characters "JJ" of the fixed portion are prepended to the read message for correction. This brings the read message to the correct code length 21, and the calculated checksum is now also correct.

In a third correction example, a message is not valid prior to the correction because the checksum was unable to be read. This initially does not alter anything about the correction options. However, the result is substantially more unreliable because a final check is not possible; only the code length can still be checked. It is appropriate here to require a repeat code reading. In some embodiments, every code is anyway read multiple times; there is then the possibility of increasing the corresponding threshold value for multiple successful decodings to be able to be sufficiently sure that the characters were able to be read without error in the positions of the variable portion.

A case analysis in turn follows the correction of step S5. If no valid message was also not able to be restored by the correction, a reading error (NoRead in this case) remains in a step S6. If, on the other hand, the correction was successful, the method is continued with a recognition of misreadings in a step S7. The second path of the case analysis following step S3 also opens into this step S7 if namely the message was already valid without a correction in accordance with step S5. Differing from FIG. 6, it would also be conceivable in another respect always to carry out the correction in accordance with step S5, also for messages already valid after step S3 depending on whether the original reading of the message or of the scheme should no longer be trusted.

In step S7, misreads (MisRead) are now still recognized. They are those cases in which a valid message was read with or without a correction in accordance with step S5 in which in particular the checksum calculated from the utility characters and the read checksum coincide. This validation is namely, as already discussed in the introduction, only reliable in a one-error case; multiple errors can randomly produce a correct checksum.

It can first optionally be ensured, if this was not already carried out in step S3 or S5, that the scheme matches the message with reference to a comparison of the fixed portion of the scheme with the corresponding characters of the message at the position of the fixed portion. The fixed portion must be in coincidence with a minimum portion of, for example, 50% for this purpose.

A check is made for the variable portion of the scheme whether the variable characters of the read message are at the associated positions in the partial ranges of the scheme. If, for example, the scheme requires a numeral at one position, but a special character was rather read, the message is considered not valid. In addition, a check can be made whether the code length of the scheme is the same as that of the read message. A message still invalid in accordance with the criteria of step S7 ends the sequence in accordance with FIG. 6 in step S6 without a valid reading (MisRead in this case).

The message is otherwise considered valid. The decoder was originally able to read it without error, or it was possible to correct it in step S5 and no misread was also recognized in step S7. The message is output in a step S8 or was further processed using steps already usual prior to the invention.

In some now following examples for the recognition of misreads, the scheme that was taught in FIG. 4 continues to be used. The message "JJD014600005183211" was read in a first, very simple example. With 18 characters it is too short with respect to the code length 21 of the scheme and is therefore a misread.

The message "JJD01460000 MJ 8321108" was read in a second example. The code length is now correct, but a reading of "MJ" upper case letters was made at the positions printed in bold instead of the numerals of the scheme. It is likewise a misread.

In a third example, a misread is present that can also not be discovered by the process in accordance with step S7. Unlike the fixed characters, the variable characters allow a certain leeway, with multiple errors with respect to the checksum being compensated. The checksum can be correctly read here or can even be read incorrectly and so be part of the multiple errors. The correct message now reads "JJD014600009283279219"; what was read was "JJD014600009275279219", with numerals marked in bold at which a correction with an incorrectly read sum was made. This error is not recognizable. On the one hand, the check sum is correct; its function was so-to-say used up by the correction attempt made. Numerals were additionally inserted; the scheme is thus satisfied. If the correction via the checksum had not inserted any numerals, this would have been noticeable via the scheme. In this third example, the read message in step S8 is considered valid even though it is actually a misread (MisRead). The correction attempt via the checksum could naturally have been dispensed with; it would then have remained a non-read (NoRead). This risk is always present with a correction via the checksum, as already discussed in the introduction; the reading rate thus increases (fewer NoReads), but simultaneously also the risk of a misread (MisRead). The latter risk can at least be further reduced by the schemes in accordance with the invention.

It is sensible to show or to represent the schemes in a clear, understandable manner. This facilitates the diagnosis and a possible manual optimization, but also the error-free and systematic programming of the steps related to the schemes. In a simple implementation, limits of the partial ranges can be appended to the positions of a scheme, as in the example of FIG. 4. This can be expanded to lists having the limits of a plurality of classes and/or permitted characters of the partial ranges.

This can be expressed as follows in pseudocode: The list of classes ("Type") can be expanded here, in particular by those of FIG. 5.

```
Scheme = Array of CodeCharScheme;
CodeCharScheme = List of SingleSchemeEntry;
SingleSchemeEntry =
Record
    Type : (SingleCharacter, CharInterval);
    Value : Char; /* SingleLetter, e.g. a SpecialCharacter */
    Min, Max : Char; /* An interval is thereby described */
End:
```

A further alternative to the description of schemes is represented by regular expressions. The definition of schemes is thus due to a strictly defined structure that is familiar to many users and for which there are standard modules for designing, editing, and converting. An example for a scheme defined as a regular expression is "JJD . . . [a-z][a-z][0-9] . . . ". It begins with a fixed portion "JJD" followed by three random characters, subsequently two lower case letters, a numeral, and then again three random characters. It must be noted that by no means every regular expression can be a scheme; for example "^ . . . [0-0] . . . $" would contain a section start and a section end, which can have no correspondence in the schemes. The editing function should not offer these options at all or at least intercept them by warnings.

It is conceivable to design proprietary systematics or a language for schemes that replaces regular expressions. This can then be better adapted to the requirements of the schemes. Upper case letters can, for example, be marked by "C", lower case letters by "c", and numerals by "N" while fixed characters appear in parentheses and free characters are still represented by a ".". This would then produce the more compact notation "[JJD] . . . ccN . . . " for the above example of a regular expression.

The invention claimed is:

1. A method of reading an optical code that encodes a message, the message having a character chain with a plurality of characters, said method comprising the steps
    recording image data having the optical code;
    evaluating the image data with a reading of the message,
    comparing the read characters of the message with a scheme that contains a fixed character for at least one position of the message that is expected at this position in codes to be read;
    and recognizing an incorrectly read message and/or correcting the read message with reference to the comparison with the scheme,
    wherein the scheme contains a variable character that is expected at this position in codes to be read for at least one position of the message, with a variable character being set to a partial range of the possible characters, but not to a fixed character.

2. The method in accordance with claim 1,
wherein the scheme has a code length and/or contains a fixed character or a variable character for every position.

3. The method in accordance with claim 1,
wherein that scheme is selected as the scheme to be used from a plurality of schemes whose fixed characters are best located in the read message.

4. The method in accordance with claim 1,
wherein the code has a checksum and the reading of the message is validated with reference to the checksum.

5. The method in accordance with claim 4,
wherein a character not falling into the partial range of the characters possible for the variable character or a non-readable character corrected by means of the checksum and the result is only accepted as a correctly read message when the corrected character falls in the partial range of the characters possible for the variable character.

6. The method in accordance with claim 1,
wherein the remaining fixed characters of the scheme are taken over into the message when a minimum portion of the fixed characters of the scheme was correctly read in the message.

7. The method in accordance with claim 6,
wherein the minimum portion of the fixed characters of the scheme at least half of the fixed characters.

8. The method in accordance with claim 1,
wherein a message whose length does not coincide with the code length of the scheme or that has a character at a position of a variable character that does not fall in the partial range of the characters possible for the variable character is classified as a misreading.

9. The method in accordance with claim 1,
wherein a scheme has at least one of the following partial ranges of the possible characters of a variable character: non-printable characters, special characters, numerals, letters, lower case letters, upper case letters.

10. The method in accordance with claim 9,
wherein the possible characters comprise ASCII codes.

11. The method in accordance with claim 1,
wherein a scheme is formulated as a regular expression that indicates the permitted characters for the respective positions.

12. The method in accordance with claim 1,
wherein a plurality of read messages are evaluated to teach a scheme.

13. The method in accordance with claim 12,
wherein the read messages are detected in operation or being loaded from a logfile.

14. The method in accordance with claim 12,
wherein a scheme is taught from a distribution of read characters at the respective positions of the read message.

15. The method in accordance with claim 12,
wherein the corresponding fixed character is taught at positions at which the same character is always read and the partial range formed therefrom is taught as a variable character at positions at which different characters are read.

16. The method in accordance with claim 12,
wherein a scheme is first initialized with blank regions per position, the respective first character read at a position is stored for this position, and every character that is read at a position after the first character for this position and that was still unknown for this position expands the partial range for this position such that the read character is covered.

17. An optoelectronic code reader having at least one light reception element for generating image data from received light and having a control and evaluation unit in which a method of reading optical codes is implemented, said method comprising the steps recording image data having the optical code;
evaluating the image data with a reading of the message,
comparing the read characters of the message with a scheme that contains a fixed character for at least one position of the message that is expected at this position in codes to be read;
and recognizing an incorrectly read message and/or correcting the read message with reference to the comparison with the scheme,
wherein the scheme contains a variable character that is expected at this position in codes to be read for at least one position of the message, with a variable character being set to a partial range of the possible characters, but not to a fixed character.

* * * * *